US009153573B2

(12) United States Patent
Yamada

(10) Patent No.: US 9,153,573 B2
(45) Date of Patent: Oct. 6, 2015

(54) SEMICONDUCTOR APPARATUS COMPRISED OF TWO TYPES OF TRANSISTORS

(71) Applicant: SUMITOMO ELECTRIC INDUSTRIES, LTD., Osaka, Osaka (JP)

(72) Inventor: Fumio Yamada, Kofu (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 11 days.

(21) Appl. No.: 13/904,100

(22) Filed: May 29, 2013

(65) Prior Publication Data

US 2013/0321082 A1 Dec. 5, 2013

(30) Foreign Application Priority Data

May 30, 2012 (JP) .................................. 2012-123344

(51) Int. Cl.
*H03F 3/16* (2006.01)
*H01L 27/06* (2006.01)
(Continued)

(52) U.S. Cl.
CPC ........ *H01L 27/0605* (2013.01); *H01L 25/0652* (2013.01); *H01L 25/0657* (2013.01); *H01L 25/18* (2013.01); *H01L 25/50* (2013.01); *H01L 29/2003* (2013.01); *H01L 29/66462* (2013.01); *H01L 29/7783* (2013.01); *H01L 29/7787* (2013.01); *H03F 1/0272* (2013.01); *H03F 3/193* (2013.01); *H03F 3/21* (2013.01); *H03F 3/211* (2013.01); *H03F 3/24* (2013.01); *H01L 21/8252* (2013.01); *H01L 24/05* (2013.01); *H01L 24/06* (2013.01); *H01L 24/13* (2013.01); *H01L 24/16* (2013.01); *H01L 27/085* (2013.01);
*H01L 2224/0401* (2013.01); *H01L 2224/04042* (2013.01); *H01L 2224/0557* (2013.01); *H01L 2224/06181* (2013.01); *H01L 2224/131* (2013.01); *H01L 2224/16145* (2013.01); *H01L 2224/48091* (2013.01); *H01L 2224/48145* (2013.01); *H01L 2224/73265* (2013.01); *H01L 2225/06506* (2013.01); *H01L 2225/06513* (2013.01); *H01L 2225/06541* (2013.01); *H01L 2225/06568* (2013.01); *H01L 2225/06589* (2013.01); *H01L 2924/00014* (2013.01);
(Continued)

(58) Field of Classification Search
CPC ............ H03F 3/16; H03F 3/187; H03F 3/195
USPC .............. 330/277, 307, 124 R, 295; 257/133, 257/192, 458
See application file for complete search history.

(56) References Cited

U.S. PATENT DOCUMENTS 8,345,434 B2 * 1/2013 Takagi ...................... 361/761
2010/0328996 A1 * 12/2010 Shih et al. .................... 365/163
(Continued)

FOREIGN PATENT DOCUMENTS

JP 6-232661 A 8/1994

*Primary Examiner* — Henry Choe
(74) *Attorney, Agent, or Firm* — Smith, Gambrell & Russell LLP.

(57) ABSTRACT

A semiconductor apparatus that includes two types of transistors is disclosed. A first semiconductor chip includes the first semiconductor device of a transistor type of GaAs-HEMT, while, a second semiconductor chip includes a second semiconductor device of a transistor type GaN-HEMT. The second semiconductor device is formed on a SiC substrate, and the first semiconductor chip is mounted in an inactive region of the SiC substrate.

11 Claims, 9 Drawing Sheets

(51) Int. Cl.
| | |
|---|---|
| *H01L 25/00* | (2006.01) |
| *H03F 3/21* | (2006.01) |
| *H03F 1/02* | (2006.01) |
| *H03F 3/193* | (2006.01) |
| *H03F 3/24* | (2006.01) |
| *H01L 25/065* | (2006.01) |
| *H01L 25/18* | (2006.01) |
| *H01L 29/66* | (2006.01) |
| *H01L 29/778* | (2006.01) |
| *H01L 29/20* | (2006.01) |
| *H01L 23/00* | (2006.01) |
| *H01L 21/8252* | (2006.01) |
| *H01L 27/085* | (2006.01) |

(52) U.S. Cl.
CPC .............. *H01L2924/1033* (2013.01); *H01L 2924/10253* (2013.01); *H01L 2924/10272* (2013.01); *H01L 2924/10329* (2013.01); *H01L 2924/10336* (2013.01); *H01L 2924/10337* (2013.01); *H01L 2924/10344* (2013.01); *H01L 2924/12032* (2013.01); *H01L 2924/1306* (2013.01); *H01L 2924/13052* (2013.01); *H01L 2924/13064* (2013.01); *H03F 2200/408* (2013.01); *H03F 2200/411* (2013.01)

(56) References Cited

U.S. PATENT DOCUMENTS

| | | | |
|---|---|---|---|
| 2011/0044016 A1* | 2/2011 | Takagi | 361/761 |
| 2011/0095364 A1* | 4/2011 | Stecher et al. | 257/337 |
| 2012/0012945 A1* | 1/2012 | Inoue | 257/401 |
| 2012/0099357 A1* | 4/2012 | Morita | 363/131 |

* cited by examiner

SEMICONDUCTOR APPARATUS COMPRISED OF TWO TYPES OF TRANSISTORS

BACKGROUND OF THE INVENTION

1. Field of the Invention

The present application relates to a semiconductor apparatus, in particular, the application relates to a power amplifier including semiconductor devices.

2. Related Background Arts

A power amplifier including a plurality of transistors each connected in series has been well known in the field. A multi-stage architecture of the semiconductor transistors is preferable to obtain a desirable gain. A Japanese patent application published as JP-H06-232661A has disclosed such a multi-stage power amplifier.

Recently, nitride semiconductor materials such as GaN, AlGaN, and so on, have been attracted because of their excellent voltage endurance. However, nitride based transistors show linearity insufficient for some applications. For instance, a multi-stage power amplifier constituted by nitride based transistors show far insufficient linearity.

On the other hand, transistors primarily comprised of GaAs based material such as GaAs, InGaAs, and so on show acceptable linearity when they are installed in a multi-stage power amplifier, but the output power thereof is still insufficient compared with those constituted by nitride transistors. A practical combination of GaAs based transistor with nitride transistors has been expected in the field.

SUMMARY OF THE INVENTION

One aspect of the present application relates to a configuration of a semiconductor apparatus. The semiconductor apparatus includes the first semiconductor chip that provides the first transistor therein, and the second semiconductor chip that includes a SiC substrate. The SiC substrate provides the inactive region to mount the first semiconductor chip thereon and the active region that provides a semiconductor layer where the second transistor is formed. A feature of the embodiment of the present application is that the first semiconductor chip is mounted on the inactive region of the SiC substrate.

Because the first semiconductor chip is separated from the second semiconductor chip, the first semiconductor chip may implement the first transistor independent of the second transistor. The second transistor may be based on nitride based materials, such as GaN, AlGaN, and so on. However, a transistor primarily based on nitride semiconductor materials shows a poor linearity in spite of the voltage endurance thereof. Embodiments of the present application may provide one of solutions to compensate this degraded linearity of the nitride transistor by introducing another type of transistor, namely, a transistor made of GaAs based material by a simple arrangement and process.

Another aspect of the present application relates to a process to form a semiconductor apparatus to compensate the non-linearity of GaN based transistor. The process includes steps of: growing a semiconductor layer including a nitride semiconductor material on a SiC substrate; forming an inactive region on the SiC substrate by removing a portion of the grown semiconductor layer, or implanting ions into a portion of the semiconductor layer and the SiC substrate; forming electrodes on the semiconductor layer to constitute a transistor and interconnections in the inactive region of the SiC substrate; forming substrate via hole to pierce the SiC substrate and the semiconductor layer to the electrodes, and another substrate via hole to pierce the SiC substrate to the interconnections; and mounting the the first semiconductor chip on the interconnection.

The first semiconductor chip may include the first transistor type of, what we call, GaAs transistor; while, the second transistor formed in the semiconductor layer is the type of GaN transistor. The process of the embodiment couples the GaN transistor with the GaAs transistor to compensate the nonlinearity inherently attributed to the GaN transistor by coupling with the GaAs transistor only by stacking the first semiconductor chip including the GaAs transistor on the second semiconductor chip including the GaN transistor.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF PREFERRED EMBODIMENTS

Figure 1:
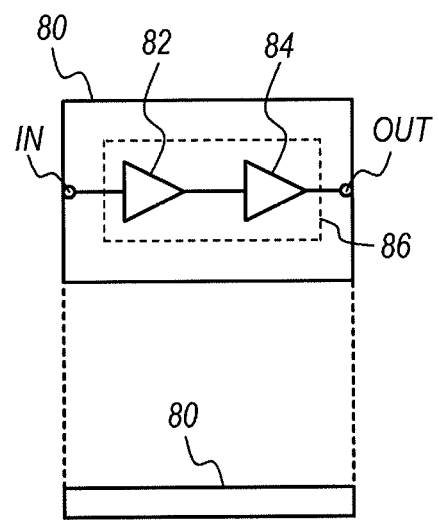
FIG. 1 schematically illustrates a semiconductor apparatus comparable to the present invention.

An example comparable to the present invention will be firstly described. FIG. 1 schematically illustrates a semiconductor apparatus according to a comparable example, where FIG. 1 includes a plan view and a cross section thereof. The semiconductor apparatus provides two transistors, 82 and 84, formed on a semiconductor chip 80 and connected in series to constitute a power amplifier 86. The first stage transistor 82 couples with the input IN, while, the second stage transistor 84 couples with the output OUT.

Figure 2A:
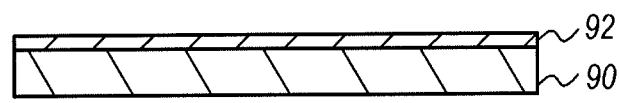
FIGS. 2A to 2C show processes for the semiconductor apparatus shown in FIG. 1.
Figure 2B:
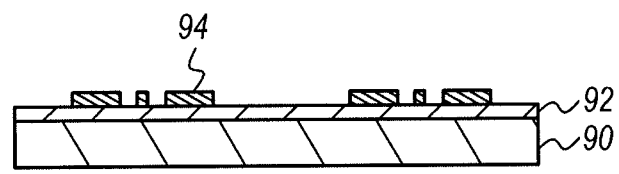
Figure 2C:
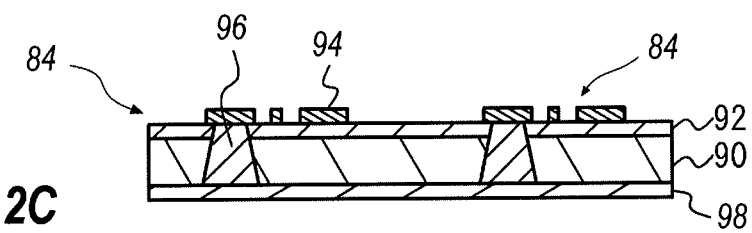

FIGS. 2A to 2C explain a process to form the semiconductor apparatus shown in FIG. 1. The process first forms an epitaxial layer 92 on a substrate 90 made of, for instance, silicon carbide (SiC), as shown in FIG. 2A. The epitaxial layer 92 includes an i-type GaN channel layer and an n-type AlGaN doped layer on the channel layer, where the doped layer supplies carriers within the channel layer. A two dimensional electron gas (2-DEG) is formed in the channel layer at an interface with the doped layer, which realizes, what is called, the high electron mobility transistor (HEMT), Next, metallic patterns 94 including electrodes and interconnections are formed on the epitaxial layer 92 as shown in FIG. 2B.

Thus, the transistors, 82 and 84, shown in FIG. 1 are formed. The transistors, 82 and 84, are what we call the GaN-HEMT. Lastly, substrate via-holes are formed so as to pierce the substrate 90 and the epitaxial layer 92. The substrate via-holes are filled with a via metal 96, which may be made of gold (Au), to connect the metallic patterns 94 on the primary surface of the substrate 90 with the back metal 98. The metallic patterns 94 connected to the back metal 98 by via metals 96 are typically the source electrode.

The comparable semiconductor apparatus, as described above, includes two GaN-HEMT transistors, 82 and 84, each providing the epitaxial layer 92 common to the two transistors. However, it is well known in the field that GaN-HEMTs have an inferior or insufficient linearity and, when two GaN-HEMTs are sequentially arranged, the linearity of the semiconductor apparatus including such two GaN-HEMTs further degrades the linearity.

First Embodiment

Figure 3:
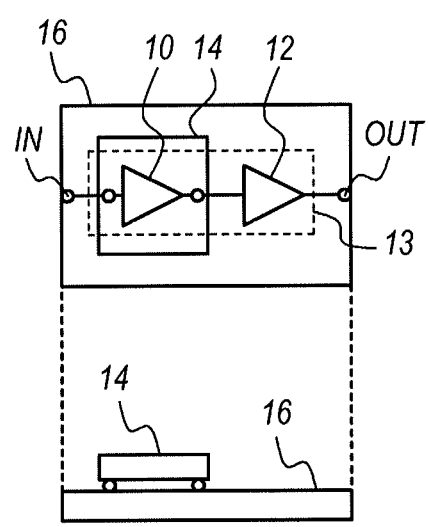
FIG. 3 schematically illustrates a semiconductor apparatus according to an embodiment of the invention.

FIG. 3 schematically illustrates a semiconductor apparatus according to an embodiment of the invention, where the semiconductor apparatus is a type of a power amplifier 13. The power amplifier 13 has a configuration that two transistors, 10 and 12, are sequentially arranged between the input IN and the output OUT, like those of the comparable example shown in FIG. 1 but the first transistor 10 is formed on the first semiconductor chip 14, and this first semiconductor chip 14 is mounted on the second semiconductor chip 16 where the second transistor 12 is formed. As described later in the specification, the first transistor 10 is a type of a GaAs-HEMT; while, the second transistor 12 is a type of a GaN-HEMT formed on the SiC substrate. The first semiconductor chip 14 is mounted on an inactive region of the second semiconductor chip 16.

Because the first semiconductor chip 14 is mounted on the second semiconductor chip 16 accompanied with, for instance, bump electrodes; the power amplifier 13 thus configured may suppress the degradation in high frequency performance thereof compared with the comparable arrangement where two transistors are commonly mounted on a substrate.

When the first semiconductor chip 14 is mounted just above the active region of the second semiconductor chip 16, this further shortens a length of wirings therebetween and makes a device area narrower. However, an overlapping of the two transistors possibly increases parasitic capacitance, which may degrade high frequency performance; and duplicates heat dissipating paths of respective transistors which makes thermal responses of the apparatus unstable.

Arranging the first semiconductor chip 14 on the inactive region of the second semiconductor chip 16 reduces parasitic capacitance between the two transistors, 10 and 12, and distinguishes the heat dissipating paths. In particular, when the second semiconductor chip 16 is made of SiC, (SiC is a well-known material showing good thermal conductivity.), the second semiconductor chip 16 shows a function of a heat sink for the first semiconductor chip 14.

Figure 4A:
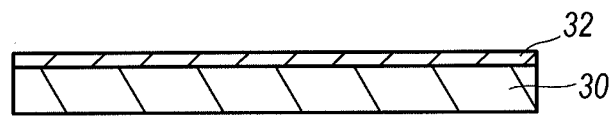
FIGS. 4A to 4E show processes for forming the semiconductor apparatus shown in FIG. 3.
Figure 4B:
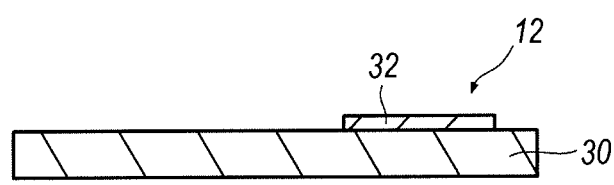
Figure 6:
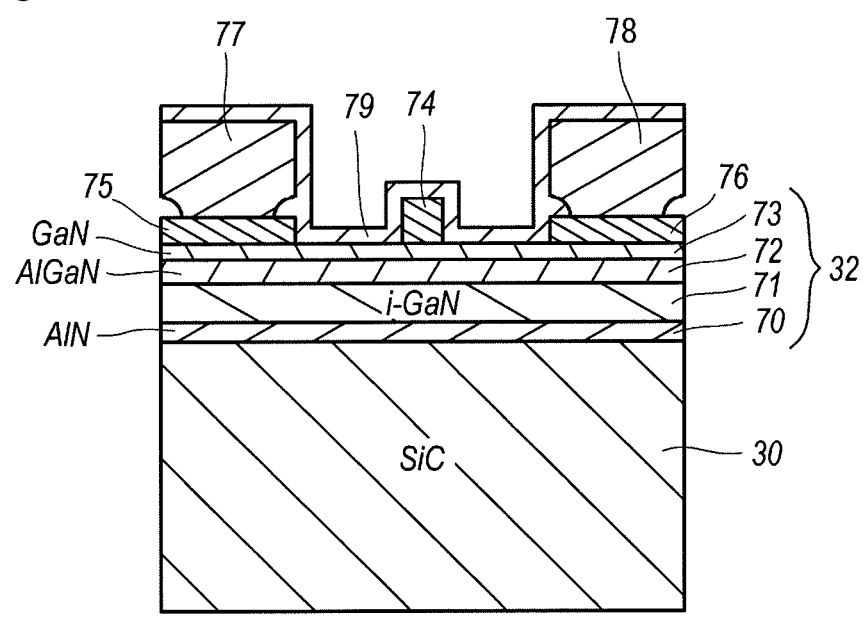
FIG. 6 shows a layer structure of another semiconductor device type of GaN-HEMT implemented in the semiconductor apparatus shown in FIG. 3 as the second transistor.

FIGS. 4A to 4E show processes to form the semiconductor apparatus shown in FIG. 3 according to an embodiment of the invention. The process first forms an epitaxial layer 32 of a type of GaN on the substrate 30 made of SiC, as shown in FIG. 4A. The SiC substrate 30 may show a function to reduce leak currents between two transistors, 10 and 12. The epitaxial layer 32 of the embodiment, as shown in FIG. 6, includes an AlN layer 70, an i-type GaN layer 71, an n-type AlGaN layer 72, and an n-type GaN layer 73 from the SiC substrate 30 in this order. Next, a portion of the epitaxial layer 32 except for a region, where the second stage transistor 12 is to be formed, is removed. This region, where the epitaxial layer 32 is removed, is the inactive region. The removal of the epitaxial layer 32 maybe carried out by dry-etching of the epitaxial layer 32 using reactive gaseous primarily including chloride (Cl). The process may use, instead of dry-etching, the ion implantation of argon ions (Ar+) implanting into the inactive region of the SiC substrate 30.

Figure 4C:
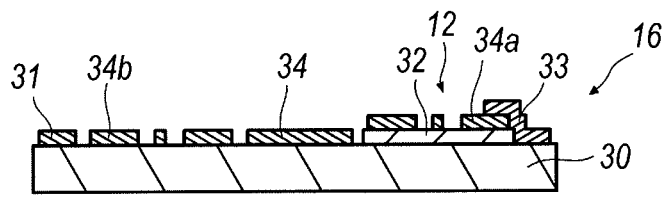

Next, the process forms metallic patterns on the SiC substrate 30 in the inactive region and the epitaxial layer 32, as shown in FIG. 4C. The metallic pattern 34a, formed on the epitaxial layer 32 corresponds to respective electrodes of the second transistor, namely, the GaN-HEMT. For the GaN-HEMT, or a field effect transistor (FET), the source and drain electrodes are what we call ohmic electrodes, while the gate electrode is a type of Schottky electrode. The metallic pattern 34a includes these ohmic and Schotkky electrodes. Another metallic pattern 34b, formed on the inactive region of the SiC substrate 30 provides pads for what we call flip-chip bonding and interconnections between the first and the second transistors, 10 and 12. The other metallic pattern 31, also formed on the inactive region of the SiC substrate 30 provides the input terminal IN and the output terminal OUT.

Figure 4D:
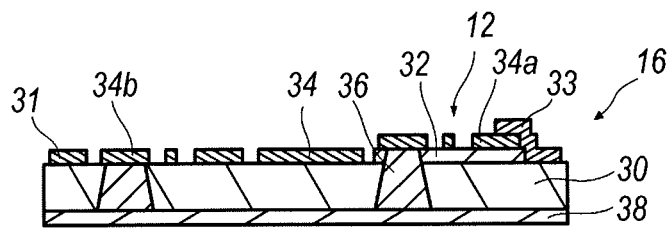

Next, the process forms the substrate via-hole piercing the SiC substrate 30 and the epitaxial layer 32 as shown in FIG. 4D, and subsequently the back metal 38 on the whole back surface of the SiC substrate 30. The substrate via-hole 36 is filled with, or at least sides thereof covered with via metals 36 electrically connecting the metallic pattern 34a, on the epitaxial layer, and/or the metallic pattern 34b, in the inactive region on the primary surface of the SiC substrate 30 with the back metal 38. Thus, the electrodes 34a, on the epitaxial layer 32 and the pads or the interconnections 34b, in the inactive region are electrically connected to the back metal 38.

As described above, the substrate via-holes 36 have two types, one of which is connected to the electrodes 34a, in the second transistor 12, while the other is for the interconnection 34b, in the inactive region of the SiC substrate 30 for assembling the first semiconductor chip 14 thereon. However, these two types of the substrate via-holes 36 are formed at the same time without increasing processing steps.

Figure 4E:
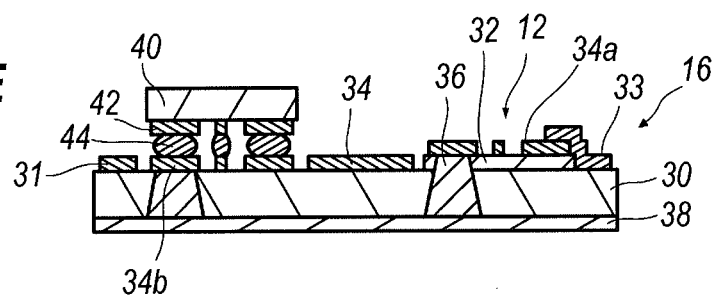

The process lastly mounts the first semiconductor chip 14 on the second semiconductor chip 16 by the flip-chip bonding. The first semiconductor chip 14 provides electrodes 42 while the second semiconductor chip 16 provides the metallic pattern 34b, on the primary surface thereof, as shown in FIG. 4E. The flip-chip bonding sticks two electrodes, 42 and 34b, by melting a solder bail 44 put between respective metallic patterns, 42 and 34b. Thus, the semiconductor apparatus according to the first embodiment of the invention is completed.

Figure 5:
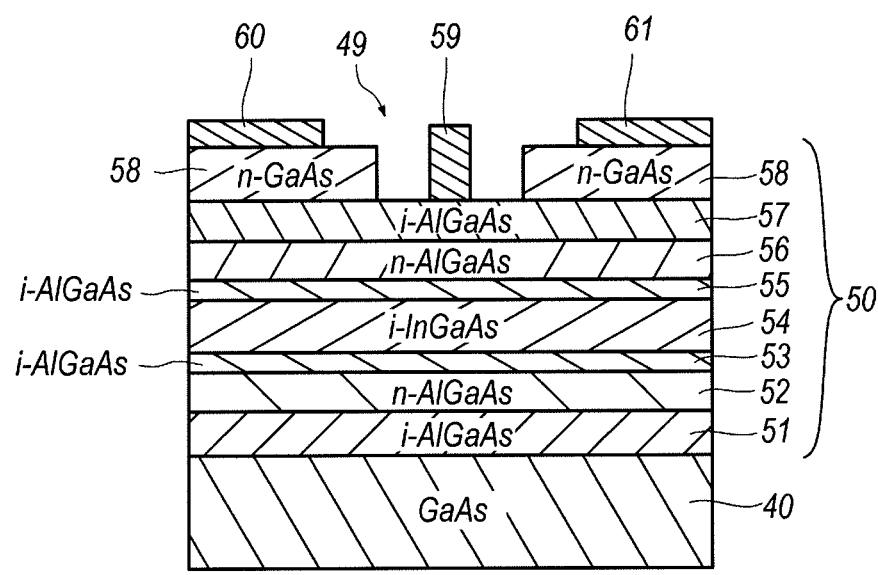
FIG. 5 shows a layer structure of a semiconductor device type of GaAs-HEMT implemented within the semiconductor apparatus shown in FIG. 3 as the first transistor.

FIG. 5 schematically shows a structure of the first transistor 10 of the type GaAs-HEMT. The first transistor 10 includes a semiconductor stack 50 on a GaAs substrate 40, where the semiconductor stack 50 comprises, from a side of the GaAs substrate 40, an i-type AlGaAs 51, an n-type AlGaAs 52, an i-type AlGaAs 53, an i-type InGaAs 54, an i-type AiGaAs 55, an n-type AlGaAs 56, an i-type AlGaAs 57, and an n-type. GaAs 58, where the description of "i-type" means a material with an intrinsic type without any intentional doping. The topmost layer, the n-type GaAs 58, provides a recess 49 within which the gate 59 is formed on the i-type AlGaAs 57, while, the source 60 and the drain 61 are provided on n-type GaAs layer 58.

The lowermost layer, the i-type AlGaAs 51, operates as a buffer layer. The n-type AlGaAs 52 and the n-type AlGaAs 56 layers operate to provide carriers in the channel layer of the i-type InGaAs 54. The i-type AlGaAs layers, 53 and 55, operate as spacer layers between the carrier supplying layers, 52 and 56, and the channel layer 54. Specifically, carriers in the channel layer 54, which originate from dopants In the layers, 52 and 56, are spatially separated from the dopants, which effectively reduces scattering of carriers running in the channel layer 54 due to ionized dopants in the carrier supplying layers, 52 and 56. The i-type AlGaAs layer 57 enhances the Schottky performance of the gate 59, while, the topmost n-type GaAs layers 58 operate as a contact layer for the source 60 and the drain 61 to reduce contact resistance.

Fig, 6 is a cross section of the second transistor 12 with the type GaN-HEMT. The second transistor 12 includes a semiconductor stack, or an the epitaxial layer, 32 on SiC substrate 30. The semiconductor stack 32 includes, from the side of the SiC substrate 30, an AlN 70, an i-type GaN 71, an Al GaN 72, and a GaN 73. The gate, source, and drain electrodes, 74, 77, and 78, are formed on the GaN 73. The source 77 and the drain 78 replenish metals, 77 and 78, thereon, where the replenished meals, 77 and 78, are formed by metal plating. Moreover, respective electrodes, 74, 77 and 78, and exposed top of the GaN 75 are covered with a passivation layer 79 made of silicon nitride (SIN).

In GaN-HEMT 12 shown in FIG. 6, the AlN 70, the i-type GaN 71, the AlGaN 72, and the topmost GaN 73 operate as a buffer, a channel layer, a carrier supplying layer, and a cap layer, respectively. Thus, the first transistor 10 is the type of GaAs-HEMT with the channel layer of InGaAs 54; while, the second transistor 12 is the type of GaN-HEMT with the channel layer of i-type GaN 71.

Figure 7A:
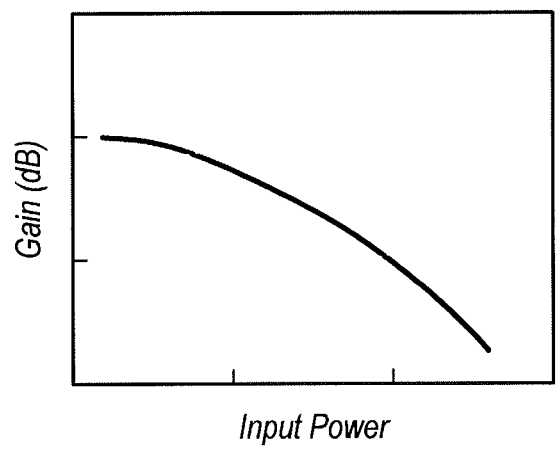
FIGS. 7A and 7B compare the linearity of transistors of type GaN-HEMT, FIG. 7A, and GaAs-HEMT, FIG. 7B.
Figure 7B:
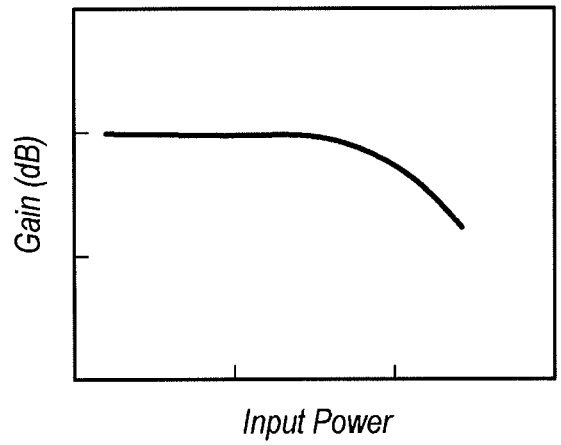

The first transistor 10 of the power amplifier 13 is a type of GaAs-HEMT with InGaAs channel layer 54, while the second transistor 12 is a type of GaN-HEMT with GaN channel layer 71. FIGS. 7A and 7B compare the linearity of the comparable power amplifier 86 (FIG. 7A) with that of the power amplifier 13 (FIG. 7B) according to the present embodiment. The former amplifier 86 explicitly shows a degraded linearity. Because the comparable amplifier only includes GaN-HEMTs, the gain thereof gradually reduces as the input power increases. On the other hand, the power amplifier 13 of the embodiment includes the GaAs-HENT for the first transistor; the degradation in the gain characteristic is efficiently suppressed, because GaAs-HEMTs generally show fine linearity compared with GaN-HEMTs.

Moreover, the power amplifier 13 of the embodiment provides the substrate 30 made of SiC generally having good thermal conductivity; accordingly, the heat dissipating function of the power amplifier 13 of the embodiment does not reduce the thermal characteristics.

(Second Embodiment)

The semiconductor apparatus according to the first embodiment of the invention shown in FIG. 3 has an arrangement of the flip-chip boding for the first semiconductor chip 14, where the first semiconductor chip 14 faces the primary surface thereof down to the second semiconductor chip 16. However, the arrangement for the first semiconductor chip 14 is not restricted to those of what we call face-down assembly. A face-up assembly accompanied with ordinary wire bonding is applicable to the semiconductor apparatus. FIGS. 8A to 8E show processes to form such semiconductor apparatus with face-up assembly.

Figure 8A:
FIGS. 8A to 8E show processes for manufacturing a semiconductor apparatus according to the second embodiment of the invention.
Figure 8B:
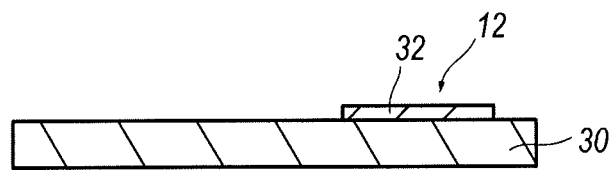
Figure 8C:
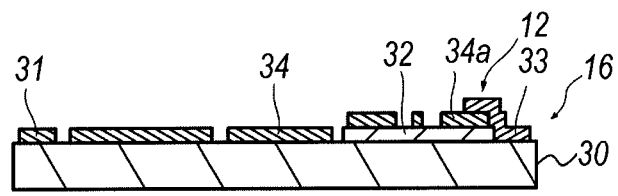
Figure 8D:
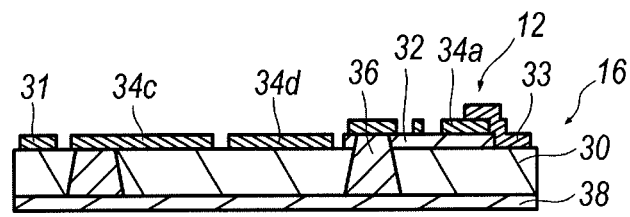

An epitaxial layer 32 is first grown on the substrate 30 (FIG.8A). Removing a portion of the epitaxial layer 32 (FIG. 8B), metal electrodes 34 and interconnections 31 are formed on the left epitaxial layer 32 and the exposed surface of the substrate 30 (FIG. 8C). The left epitaxial layer 32 and the electrodes 34a, constitute the second transistor 12 of the type GaN-HEMT. A plurality of substrate via holes filled with via metals 36 is subsequently formed to pierce the substrate 30 and the epitaxial layer 32 from the back surface of the substrate 30 (FIG. 8D). The back surface of the substrate 30 is coated with the back metal 38, where the via metals 36 are connected to the back metal 38. The processes thus described are the same as those of the first embodiment shown in FIGS. 4A to 4D.

Figure 8E:
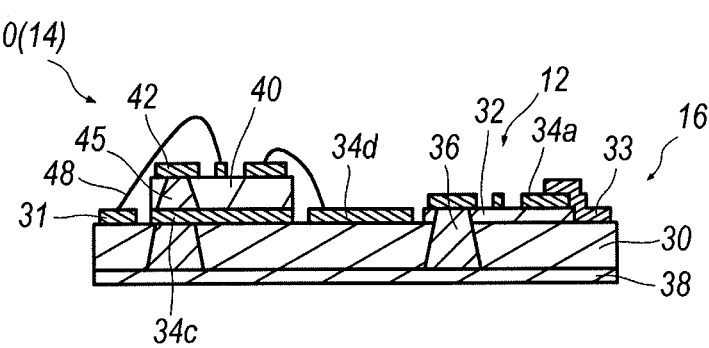

The process of the present embodiment mounts the first semiconductor chip 14 that includes the first transistor 10 therein on the primary surface of the second semiconductor chip 16 by the face-up bonding, FIG. 8E. In this process, a part of the interconnections 34c, faces and is electrically connected to the back metal of the first semiconductor chip 14, where the back metal of the first semiconductor chip 14 is connected to the via metal 45 of the first semiconductor chip 14 and the via metal 45 is connected to the electrode 42 formed in the primary surface of the first semiconductor chip 14. Thus, the electrode 42 of the first transistor of the type GaAs-HEMT is connected to the interconnection 34c, provided on the primary surface of the substrate 30 through the via metal 45, and the interconnection 34c is connected to the back metal 38 of the substrate 30 through the via metal 36. Other electrodes of the first semiconductor chip 14 are connected to the interconnections 34d on the primary surface of the substrate 30 with bonding wires 48.

The first semiconductor chip 14 of the second embodiment is also placed in the inactive region of the first semiconductor chip 16, and the electrical interference between the first and second. transistors, 10 and 12, is effectively prevented. Moreover, the heat dissipating path for the first semiconductor chip 14 is distinguished from that of the second semiconductor chip 16, and the thermal interference between two transistors, 10 and 12, is also effectively suppressed.

Third Embodiment

Figure 9A:
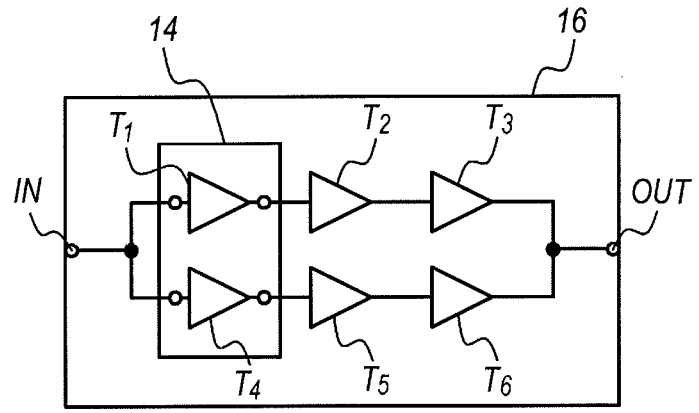
FIGS. 9A to 9C schematically show various configurations of the semiconductor apparatus according to the third embodiment of the invention.
Figure 9B:
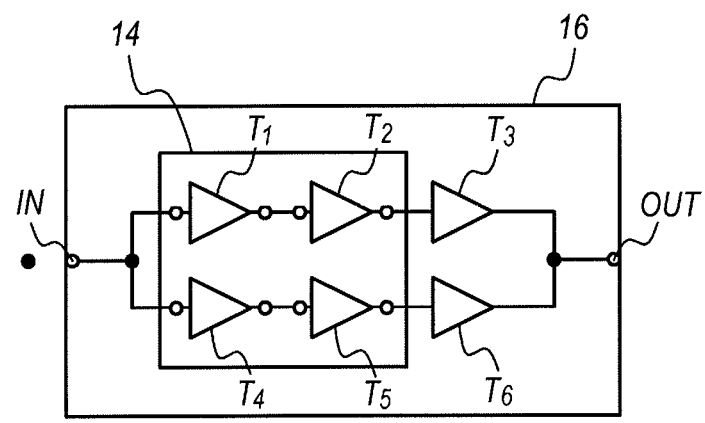
Figure 9C:
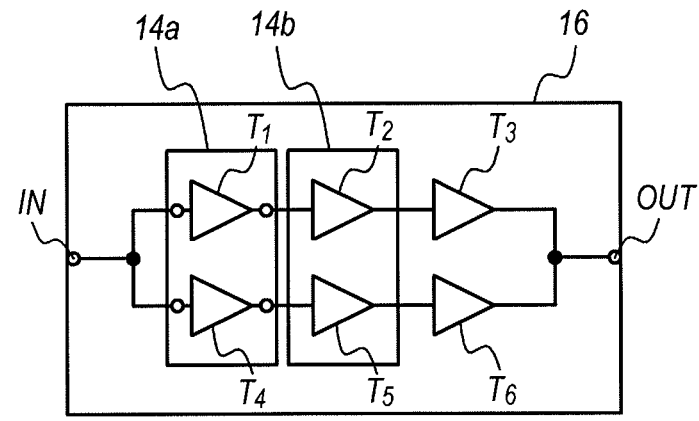

FIGS. 9A to 9C are schematic plan views of semiconductor apparatuses according to the third embodiment of the invention, where the semiconductor apparatuses each include a power amplifier with an arrangement of two arms connected in parallel to each other between input IN and output OUT terminals, and each of arms has three (3) stages. Three transistors in the respective arms are connected in series. Specifically, the three-stage amplifier includes three transistors, $T_1$, to $T_3$, and $T_4$, to $T_6$, connected in series. Transistors involved in the semiconductor chip 14 mounted on the inactive area of the second semiconductor chip 16, namely, transistors, $T_1$ and $T_4$, in FIG. 9A, transistors, $T_1$, $T_2$, $T_4$, and $T_5$, in FIG. 9B, and transistors, $T_1$, and $T_4$, and $T_2$, and $T_5$, in FIG. 9C have the type, GaAs-HEMT. On the other hand, other transistors not involved in the first semiconductor chip 14 have the type, GaN-HEMT formed on the second semiconductor chip 16.

Describing further specifically, the semiconductor apparatus shown in FIG. 9A provides the first semiconductor chip 14 that integrates two transistors, $T_1$, and $T_4$, of the type of GaAs-HEMT. The apparatus shown in FIG. 9B provides the first semiconductor chip 14 that integrates four transistors, $T_1$, $T_2$, $T_4$, and $T_5$, ,of the type of GaAs-HEMT. The apparatus shown in FIG. 9C divides the first semiconductor chip into two chips, 14a, and 14b,, the former of which integrates two transistors, $T_1$, and $T_4$, while, the latter integrates other two transistors, $T_2$, and $T_5$. In the apparatuses shown in FIGS. 9A to 9C, two transistors, $T_3$, and $T_6$, in the last stage of three-stage arrangement have the type of GaN-HEMT and formed in the second semiconductor chip 16.

Thus, the semiconductor apparatuses shown in FIGS. 9A to 9C provide at least two transistors, $T_1$, and $T_4$, with the type of GaAs-HEMT and formed in the first semiconductor chip 14 independent of the second semiconductor chip 16, and at least two transistors, $T_3$ and $T_6$, with the type of GaN-HEMT and formed in the second semiconductor chip 16 independent of the first semiconductor chip 14. Accordingly, the semiconductor apparatuses shown in FIGS. 9A to 9C may enhance the linearity thereof as securing advantages inherently attributed to GaN-HEMT.

The apparatuses shown in FIGS. 9A to 9C have the arrangement of the three-stage amplifier; however, the number of stages is not restricted to three. More than three stages are applicable to the apparatus. Moreover, the number of arms connected in parallel is also not restricted to two. Three or more arms are applicable depending on output power to be designed. Also, the number of stages in respective arms is not necessary to be equal to each other. A condition that the transistor of the first stage has the type GaAs-HEMT and the transistor of the last stage has the type GaN-HEMT is necessary for the power amplifier.

The description presented above concentrates the transistor in the first stage having the type of GaAs-HEMT. However, the first stage transistor may have other type. One of conditions requested to the first stage transistor is that it has a superior linearity for the input power. An FET made of silicon is applicable to the first stage transistor. Also, a GaAs-HEMT described above may include one of GaAs, AlGaAs, InGaAs, and/or InAlGaAs. In those HEMT, the channel layer may include GaAs or InGaAs. For a Si-based transistor, the channel layer may include Si or SiGe.

The embodiments above described include the last stage transistor type of GaN-HEMT. However, power amplifiers may include other type of transistors except for GaN-HEMT as far as a condition that the substrate 30 is made of SiC. For instance, transistors type of SiC-HEMT or SiC-FET is applicable to power amplifiers of the invention. Also, GaN-HEMTs or GaN-based transistors include one of GaN, AlN, InN, InGaN, AlGaN, InAlN, InAlGaN, and so on. The channel layer of such transistor includes GaN or InGaN.

The first stage transistor in the embodiments preferably has a gate width of 1 to 10 millimeters, while, the last stage transistor preferably has the gate width of 1 to 20 millimeters. Also, the first stage transistor is preferably supplied with a bias voltage of 3 to 12 volts, and the second stage transistor is supplied with a bias of 12 to 70 volts. However, the gate width of the transistors and the bias supplied to the transistors depend on how much power the amplifier outputs.

In the embodiments above described, the first stage transistor is one of the type formed in the first semiconductor chip, and the second stage transistor is one of the type formed in the second semiconductor chip. That is, the arrangement to connect the first semiconductor chip to the second semiconductor chip is generally applicable to chips where circuit elements except for transistors are formed.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

I claim:

1. A semiconductor apparatus, comprising:
    a first semiconductor chip providing a first semiconductor device therein; and
    a second semiconductor chip providing a substrate made of silicon carbide (SiC), the SiC substrate including an active region and an inactive region adjacent to each other, the active region including a semiconductor layer that involves a second semiconductor device therein, the SiC substrate having a substrate via hole in the inactive region, the substrate via hole having a via metal;
    wherein the first semiconductor chip is mounted in the inactive region of the SiC substrate, and
    wherein the first semiconductor device includes an electrode electrically brought to a back surface of the SiC substrate through the via metal in the substrate via hole.

2. The semiconductor apparatus of claim 1,
    wherein the second semiconductor device includes an electrode, and
    wherein the SiC substrate further has another substrate via hole having a via metal that electrically brings the electrode of the second semiconductor device out to the back surface of the SiC substrate.

3. The semiconductor apparatus of claim 1, wherein the semiconductor layer is removed from the inactive region of the SiC substrate.

4. The semiconductor apparatus of claim 1, wherein the inactive region of the SiC substrate is implanted with argon (Ar) ions.

5. The semiconductor apparatus of claim 1, wherein the first semiconductor device is electrically connected with the second semiconductor device with flip-chip bonding.

6. A semiconductor apparatus compromising:
    a first semiconductor chip providing a first semiconductor device therein; and
    a second semiconductor chip providing a substrate made of silicon carbide (SiC), the SiC substrate including an active region and an inactive region adjacent to each other, the active region including a semiconductor layer that involves a second semiconductor device therein, the inactive region of the SiC substrate mounting the first semiconductor chip thereon,
    wherein the first semiconductor device is a type of GaAs high electron mobility transistor (GaAs-HEMT) and the second semiconductor device is a type of GaN high electron mobility transistor (GaAs-HEMT), and
    wherein the GaAs-HEMT of the first semiconductor device constitutes a first stage transistor of a power amplifier and the Gan-HEMT of the second semiconductor device constitutes a final stage transistor of the power amplifier.

7. A method to form a semiconductor apparatus, the method comprising steps of:
    growing semiconductor layers on a top surface of a semiconductor substrate made of silicon carbide (SiC), the semiconductor layers including nitride semiconductor materials and constituting an active region;
    forming an inactive region in the SiC substrate;
    forming electrodes in the active region to form a nitride transistor as a GaN high electron mobility transistor (GaN-HEMT), and interconnections in the inactive region of the SiC substrate; and
    forming a substrate via hole from a back surface of the SiC substrate to the electrodes in the active region through the SiC substrate and the semiconductor layers, and another substrate via hole from the back surface of the SiC substrate to the interconnections in the inactive region;
    providing a via metal in the substrate via hole and the another substrate via hole, and
    mounting a first semiconductor chip having a GaAs high electron mobility transistor (GaAs-HEMT) on the interconnection in the inactive region of the SiC substrate.

8. The method of claim 7,
    wherein the first semiconductor chip is mounted on the interconnection by flip-chip bonding.

9. The method of claim 7,
further including a step of, after providing the via metal in the substrate via holes, forming a back metal in the back surface of the SiC substrate so as to be connected to the via metal.

10. The method of claim 7,
wherein the step of forming the inactive region is carried out by removing the semiconductor layers to expose the SiC substrate in the inactive region.

11. The method of claim 7,
wherein the step of forming the inactive region is carried out by implanting argon (Ar) ions into the semiconductor layers and the SiC substrate in the inactive region.

* * * * *